US005103123A

United States Patent [19]

McGinn

[11] Patent Number: 5,103,123

[45] Date of Patent: Apr. 7, 1992

[54] PHASE DETECTOR HAVING ALL NPN TRANSISTORS

[75] Inventor: Michael McGinn, Scottsdale, Ariz.

[73] Assignee: Motorola, inc., Schaumburg, Ill.

[21] Appl. No.: 583,756

[22] Filed: Sep. 17, 1990

[51] Int. Cl.[5] ........................ H03K 5/26; G01R 25/00

[52] U.S. Cl. .................................... 307/514; 307/262; 328/133; 328/155

[58] Field of Search ............... 307/510, 511, 514, 262, 307/494; 328/133, 134, 155; 330/288

[56] References Cited

U.S. PATENT DOCUMENTS

| | | | |
|---|---|---|---|
| 3,537,018 | 10/1970 | Modiano | 328/133 |
| 4,068,184 | 1/1978 | Ahmed | 330/288 |
| 4,808,856 | 2/1989 | Tanigawa | 307/511 |
| 4,870,303 | 9/1989 | McGinn | 328/133 |
| 4,885,484 | 12/1989 | Gray | 330/288 |

FOREIGN PATENT DOCUMENTS 0356570 9/1988 European Pat. Off. ............ 330/288

*Primary Examiner*—Timothy P. Callahan
*Attorney, Agent, or Firm*—Robert D. Atkins

[57] ABSTRACT

A phase detector is implemented with NPN transistors for providing a symmetrical push-pull output current operating in response to the phase difference between the falling edge of an oscillator signal and the mid-pulse of a sync signal. A current sinking circuit is responsive to the first and second input signals for providing a first current of predetermined magnitude and for sinking a second current of predetermined magnitude from the output of the phase detector. An NPN transistor current mirror circuit has an input responsive to the first current provided by the current sinking circuit and an output for sourcing a third current into the output of the phase detector, while a voltage equalizing circuit establishes substantially equal potentials at the input and output of the current mirror for maintaining proportional input and output current thereof.

20 Claims, 2 Drawing Sheets

SYNC SIGNAL AT INPUT 22

OSCILLATOR SIGNAL AT INPUT 24

OUTPUT CURRENT THROUGH OUTPUT 14
0
t1
t2
t3
t4
t5
TIME

PHASE DETECTOR HAVING ALL NPN TRANSISTORS

FIELD OF THE INVENTION

The present invention relates in general to phase detectors and, more particularly, to a phase detector implemented with NPN transistors.

BACKGROUND OF THE INVENTION

Phase detectors are well known in the art, for example, as an integral component of a television receiver phase lock loop for providing an output signal representative of the phase error between the mid-pulse of a sync signal and the falling edge of the output signal of a voltage controlled oscillator (VCO). In the phase lock loop example, the output signal of the phase detector is low-pass filtered and applied to the input of the VCO, as is well understood. Most, if not all, phase detectors include a lateral PNP transistor current mirror for sourcing a predetermined current from its output to charge the loop filter. The input and output of the current mirror are typically coupled to the collectors of first and second NPN transistors configured as a differential amplifier having common emitters coupled through a current source operating under control of the sync signal, while the bases of the same are driven by the output signal of the VCO and a reference signal, respectively. The output of the conventional phase detector driving the VCO may be taken at the collector of the second NPN transistor allowing the latter to sink a predetermined current equal to the charging current provided by the PNP transistor current mirror and discharge the loop filter when the oscillator signal is low with respect to the reference signal. Alternately, when the oscillator signal is high with respect to the reference signal, the output current of the PNP transistor current mirror charges the loop filter.

One problem with the lateral PNP transistors is the inherent slower switching speed as compared to the first and second NPN transistors of the differential amplifier, often creating a asymmetrical output current which causes difficulty in achieving phase lock by inducing skew between the edges of the oscillator signal and the mid-pulse of the sync signal, especially in the presence of a noisy VCO oscillator signal. Moreover, it is difficult in most semiconductor processes to achieve good matching between the PNP transistors thereby adding to the asymmetry problem in the output signal of the phase detector. In addition, most integrated circuit processes produce a poor forward transistor current gain, $\beta$, for the lateral PNP transistors forming the current mirror. Since the phase lock rate is often determined by the charge and discharge rate of the loop filter, the lateral PNP transistors must be sized large to provide a reasonable output current, say 200 microamps. The poor forward transistor current gain enlarges the difference between the input and output currents of the PNP current mirror as the base currents become significant which also induces offset in the output signal. Thus, there is a trade-off between the lock speed of the phase lock loop and the physical area of the conventional phase detector, more specifically, the size of the lateral PNP transistor current mirror. It would be desirable to eliminate the lateral PNP transistors and the undesirable properties associated therewith.

Hence, there is a need for an improved phase detector implemented with an all NPN transistor structure.

SUMMARY OF THE INVENTION

Accordingly, an object of the present invention is to provide an improved phase detector.

Another object of the present invention is to provide an improved phase detector implemented with NPN transistors.

Yet another object of the present invention is to provide an improved phase detector having a symmetrical output signal.

In accordance with the above and other objects there is provided a phase detector responsive to the phase difference between first and second input signals comprising a first circuit responsive to the first and second input signals and having a first output for providing a first current of predetermined magnitude and having a second output for sinking a second current of predetermined magnitude proportional to the first current flowing from the output of the phase detector. A current mirror circuit is provided having an input coupled for receiving the first current and having an output for sourcing a third current into the output of the phase detector, while a second circuit is coupled between the input and output of the current mirror for maintaining substantially equal potentials at the input and output of the current mirror.

DETAILED DESCRIPTION OF THE PREFERRED EMBODIMENT

Figure 1:
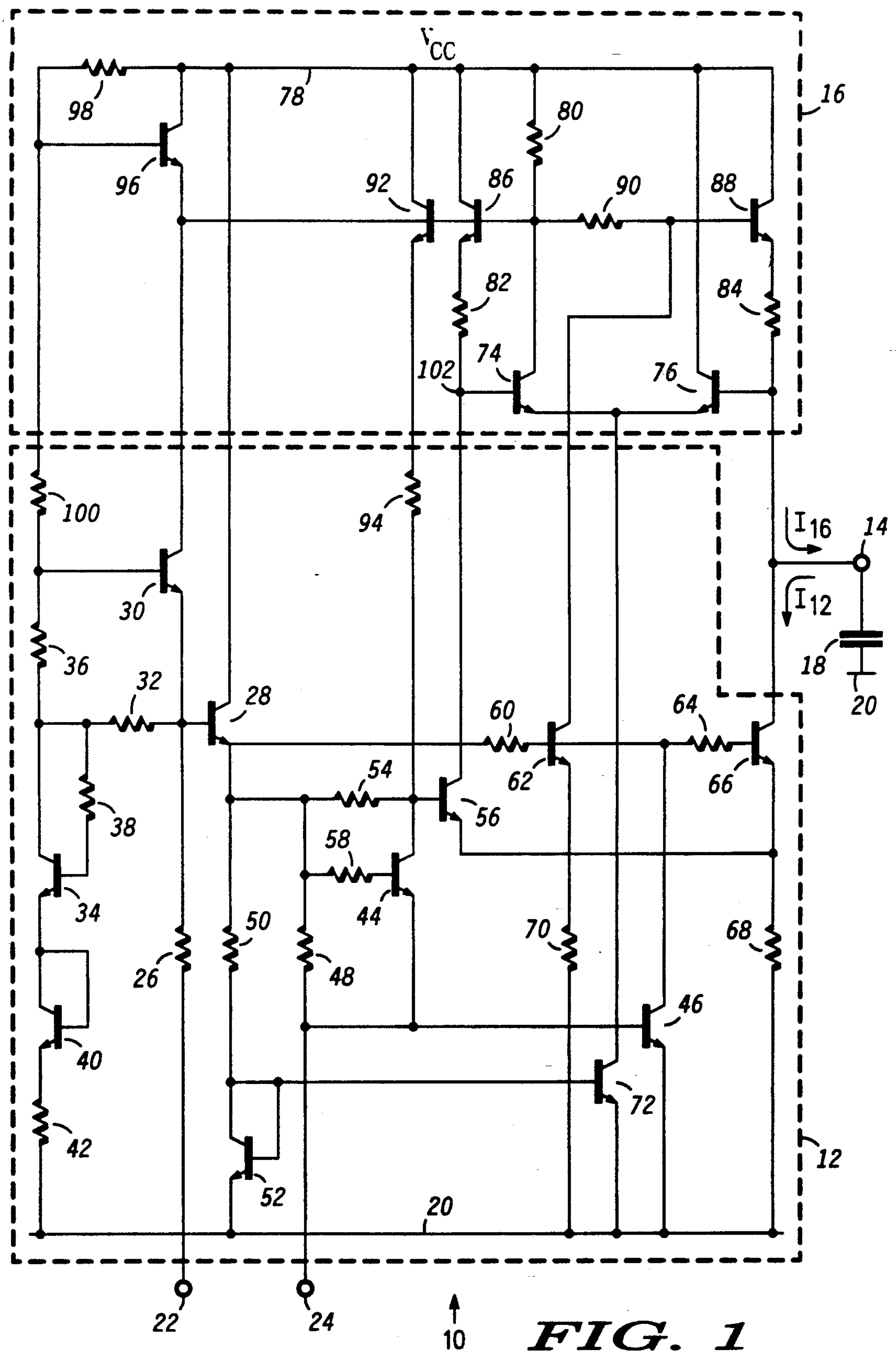
FIG. 1 is a schematic diagram illustrating the preferred embodiment of the present invention.

Referring to FIG. 1, there is shown phase detector 10 suitable for manufacturing in integrated circuit form using conventional integrated circuit processes. Phase detector 10 includes current sink circuit 12 coupled for sinking current $I_{12}$ from output terminal 14, and current source circuit 16 coupled for sourcing current $I_{16}$ into output terminal 14. For the phase lock loop example, capacitor 18 is coupled between output terminal 14 and power supply conductor 20 and operates as a low-pass filter at the input of the VCO (not shown). A sync signal is applied at input 22 while the output oscillator signal of the VCO is applied at input 24 completing the loop. The principal operation of current sink circuit 12 and current source circuit 16 is to provide current $I_{12}$ and current $I_{16}$, respectively, operating in a complementary manner during the sync pulse and combining to form a symmetrical output current waveform, the duty cycle of which varies with the phase difference between the falling edge of the oscillator signal and the mid-pulse of the sync signal.

Continuing with FIG. 1, resistor 26 is coupled between input 22 and the base of transistor 28, that is also the emitter of transistor 30. The emitter and base of transistor 30 are coupled through resistors 32 and 36 to the collector of transistor 34, respectively, while the base and collector of transistor 34 are coupled together via resistor 38. The emitter of transistor 34 is coupled through diode-configured transistor 40 and resistor 42 to power supply conductor 20 operating at ground potential. Input 24 is coupled to the emitter of transistor 44, to the base of transistor 46 and through resistor 48 to the emitter of transistor 28, the latter of which is also coupled through resistor 50 and diode-configured transistor 52 to power supply conductor 20, through resistor 54 to the base of transistor 56, through resistor 58 to the base of transistor 44 and through resistor 60 to the base of transistor 62. The base of transistor 62 is coupled to the collector of transistor 46 and continues through resistor 64 to the base of transistor 66. The emitter of transistor 56 is coupled to the emitter of transistor 66 and through resistor 68 to power supply conductor 20, while the emitter of transistor 62 is coupled through resistor 70 to power supply conductor 20. The base and collector of transistor 52 are coupled together to the base of transistor 72 forming a current mirror circuit as the emitter of transistor 72 is coupled to power supply conductor 20 and the collector of the same is coupled to the emitters of transistors 74 and 76 of current source circuit 16.

As part of the present invention, the implementation of current source circuit 16 is provided with all NPN transistors as follows. The collectors of transistors 74 and 76 are coupled to power supply conductor 78 typically operating at a positive potential such as $V_{CC}$, the former path including resistor 80. The collectors of transistors 56 and 66 are coupled to the bases of transistors 74 and 76, respectively, and through resistors 82 and 84 to the emitters of transistors 86 and 88. The base of transistor 86 is coupled to the collector of transistor 74 and through resistor 90 to the base of transistor 88, while the collectors of transistors 86 and 88 are each coupled to power supply conductor 78, and the base of transistor 88 is coupled to the collector of transistor 62. Current source circuit 16 also includes transistor 92 having a collector coupled to power supply conductor 78, a base coupled to the base of transistor 86 and an emitter coupled through resistor 94 to the collector of transistor 44, that is the base of transistor 56. It is understood that transistors 86 and 92 may be combined into a single NPN transistor having double emitters. The base of transistor 86 is also coupled to the collector of transistor 30 and to the emitter of transistor 96, the latter of which also includes a collector coupled to power supply conductor 78 and a base coupled through resistor 98 to power supply conductor 78 and through resistor 100 to the base of transistor 30.

Figures 2A, 2B, 2C:
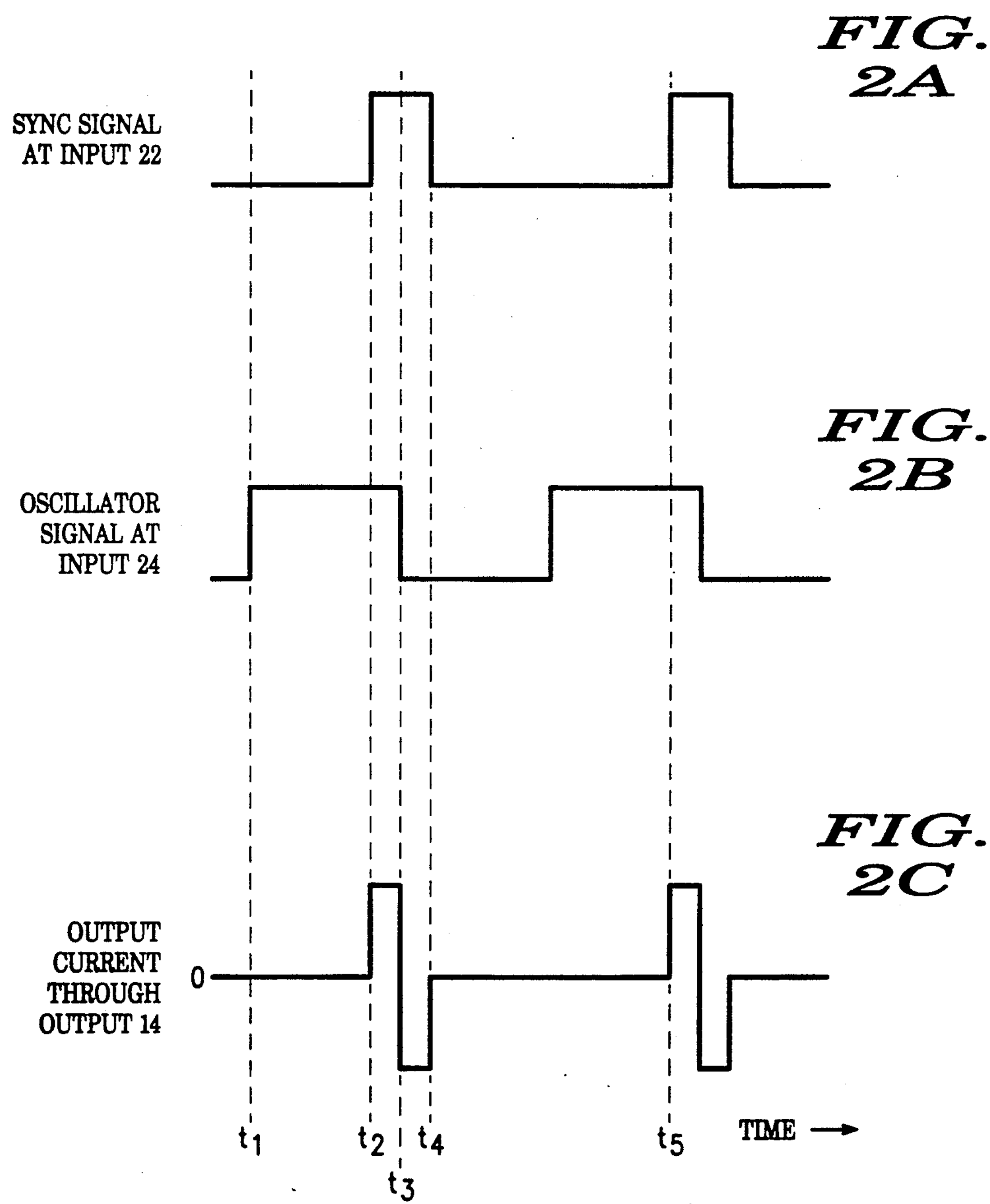
FIG. 2 (A, B, C) are waveform plots useful in the explanation of the invention.

The operation of phase detector 10 is to provide a symmetrical push-pull current flowing through output terminal 14 for charging and discharging capacitor 18 which in the present example is operating as the loop filter of a phase lock loop. The waveform shown in FIG. 2A is the sync signal applied at input 22, while the output oscillator signal from the VCO applied at input 24 is shown in FIG. 2B, the combination of which produces the symmetrical push-pull current waveform flowing through output terminal 14 as shown in FIG. 2C. At time $t_1$ of FIG. 2, the sync signal is low pulling down the base of transistor 28 and turning on transistors 30 and 96 while turning off transistors 28, 34, 40, 86, 88 and 92. Consequently, no current $I_{16}$ flows through the collector-emitter conduction path of transistor 88. The high oscillator signal applied at input 24 turns on transistor 46, pulling the bases of transistors 62 and 66 low and shutting off current $I_{12}$ flowing through the collector-emitter conduction path of transistor 66. Moreover, transistors 44, 52, 56, 72, 74 and 76 are rendered non-conductive by the high oscillator signal and low sync signal. The output current waveform is thus zero between times $t_1$ and $t_2$ as shown in FIG. 2C.

The transition of the sync signal to the high state at time $t_2$ turns on transistor 28 while reverse biasing the base-emitter junctions ($V_{be}$) of transistors 30 and 96, thereby releasing the bases of transistors 86, 88 and 92 and allowing transistor 56 to conduct current through the collector-emitter conduction path of transistor 86. The high sync signal also enables a conduction path through resistors 98, 100 and 36, transistors 34 and 40 and resistor 42 for developing a predetermined potential at the base of transistor 28 and a corresponding predetermined current flowing through transistor 28, resistor 50 and transistor 52 which is mirrored in transistor 72 for sinking a similar current from the emitters of transistors 74 and 76. Further notice that the potential developed at the base of transistor 56 is equal to the voltage across resistor 68 plus the $V_{be}$ of transistor 56 in one path, and the voltage across resistor 42 plus the $V_{be}$'s of transistors 34 and 40 minus the $V_{be}$ of transistor 28 in another path. Assuming ideal transistors having negligible base currents and equal emitter areas, a predetermined current $I_{56}$ flows through transistor 56 as the ratio of resistor 42 to resistor 68. Typical values for resistors 42 and 68 are 820 and 1600 ohms, respectively. The high oscillator signal also maintains transistor 46 in conduction and transistor 44 off between times $t_2$ and $t_3$ and, therefore, transistors 62 and 66 remain non-conductive inhibiting the flow of current $I_{12}$.

At time $t_2$, the voltage across capacitor 18 appearing at the base of transistor 76 has a particular value depending upon the phase difference between the falling edge of the oscillator signal and the mid-pulse of the sync signal. As the predetermined current begins to flow through transistor 56, the collector voltage thereof falls possibly below the potential at the base of transistor 76. The majority of the current sunk by transistor 72 then flows through transistor 76 causing the potential at the base of transistor 86 to rise since transistor 74 is only partially on. The base voltage of transistor 86 increases to an appropriate value to conduct current $I_{56}$ through the collector-emitter conduction path of transistor 86, neglecting the base current of transistor 74, thereby pulling the voltage developed at the base of transistor 74 (node 102) to a value substantially equal to the voltage at the base of transistor 76.

The combination of NPN transistors 86 and 88 operates as a current mirror whereby the current flowing through transistors 56 and 86 is reflected in the collector-emitter conduction path of transistor 88 and flows through output terminal 14 as current $I_{16}$. Unlike conventional PNP current mirrors wherein the emitters are coupled to a source of operating potential, the NPN transistor current mirror of the present invention requires a voltage equalizing circuit, such as the emitter-coupled transistor pair 74 and 76, for maintaining the potentials at node 102 and output terminal 14 substantially equal. Furthermore, resistors 82 and 84 are provided for scaling the output current $I_{16}$ of the NPN transistor current mirror (86, 88). Typical values for resistors 82 and 84 are 820 and 920 ohms, respectively. Starting at node 102 and writing the loop equation around transistors 74, 76, 86 and 88, the input and output currents of the NPN transistor current mirror are related as follows:

$$R_{82} \cdot I_{56} + V_{86} - V_{88} - R_{84} \cdot I_{16} - V_{76} + V_{74} = 0 \quad (1)$$

where:

$R_{82}$ is the value of resistor 82

$V_{86}$ is the base-emitter junction potential of transistor 86

$V_{88}$ is the base-emitter junction potential of transistor 88

$R_{84}$ is the value of resistor 84

$V_{74}$ is the base-emitter junction potential of transistor 74

$V_{76}$ is the base-emitter junction potential of transistor 76

Given equal emitter areas for transistors 86 and 88 and transistors 74 and 76, equation (1) may be reduced to:

$$R_{82} \cdot I_{56} - R_{84} \cdot I_{16} = 0$$

$$I_{16}/I_{56} = R_{82}/R_{84} \quad (2)$$

Thus, the current $I_{16}$ is set by the value of resistors 82 and 84 and current $I_{56}$, the latter of which as previously discussed is set by the ratio of resistors 42 and 68.

Although the present invention is operative as described, equation (2) is based upon the approximation that $V_{76} = V_{74}$ for all conditoins. Consider removing this approximation such that the $V_{be}$ of transistors 74 and 76 may differ slightly, say in response to temperature dependent loading on output terminal 14, equation (1) reduces to the following:

$$R_{82} \cdot I_{56} + V_{74} = R_{84} \cdot I_{16} + V_{76} \quad (3)$$

The assumption that $V_{86} = V_{88}$ is still reasonable since any variation in the voltage at output terminal 14 is absorbed across resistor 84 allowing the potential developed at the emitter of transistor 88 to follow the emitter potential of transistor 86. However, such variation in the voltage at output terminal 14 is directly applied to the base of transistor 76 causing voltage $V_{76}$ to increase and voltage $V_{74}$ to decrease. Therefore from equation (3), current $I_{16}$ would decrease slightly as the voltage at output terminal 14 increases if it were not for the feedback path formed of transistor 92 and resistor 94 coupled between the base of transistor 86 and the base of transistor 56. Should the voltage developed at output terminal 14 increase, transistor 76 conducts more of the current $I_{72}$ flowing through transistor 72 causing the base voltage of transistor 86 to rise as transistor 74 conducts less current thereby increasing the current flowing through transistor 92 and resistor 94. This increases both the voltage at the base of transistor 56 and the current $I_{56}$ allowing the emitter voltage of transistor 86 to rise and likewise for the emitter voltage of transistor 88 to a value which maintains substantially constant current $I_{16}$ through resistor 84 into output terminal 14. Therefore, current $I_{16}$ remains substantially constant with changes in the output voltage.

Continuing with the time line of FIG. 2, at time $t_3$ the oscillator signal drops low turning off transistor 46, thereby releasing the bases of transistors 62 and 66 allowing a portion of the current from transistor 28 to render transistors 62 and 66 conductive and sink current $I_{12}$ from output terminal 14 through the collector-emitter conduction path of the latter. The low oscillator signal also enables transistor 44 to conduct through transistor 28 and resistor 54 which pulls the base of transistor 56 low and shuts off current $I_{56}$. In addition, the collector voltage of transistor 62 pulls down the base of transistor 88, shutting off current $I_{16}$, while transistor 76 continues to conduct current $I_{72}$. The value of current $I_{12}$ is set via the current source formed of transistor 66 and resistor 68 operating in response to the aforedescribed predetermined potential established at the base of transistor 28 less the $V_{be}$ thereof. Thus, between times $t_3$ and $t_4$ when the sync signal is high and the oscillator signal is low, current $I_{12}$ flows at a predetermined constant value from output terminal 14 through the collector-emitter conduction path of transistor 66 for discharging capacitor 18. Between times $t_4$ and $t_5$, the sync signal is low again, turning of transistor 28 and turning on transistor 30 and 96 thereby disabling currents $I_{12}$ and $I_{16}$ in the aforedescribed manner as shown in FIG. 2C. The cycle repeats following time $t_5$.

The phase detector is thus responsive to the falling edge of the oscillator signal within the sync signal pulse. For example, if the frequency of the oscillator signal increases, the falling edge of the oscillator signal occurs prior to the mid-pulse of the sync signal, whereby current $I_{12}$ conducts for a longer period of time as compared to the current $I_{16}$, reducing the charge on capacitor 18 pulling the VCO oscillator signal back to the mid-pulse of the sync signal. Alternately, if the frequency of the oscillator signal decreases and the falling edge of the oscillator signal occurs later than the mid-pulse of the sync signal, current $I_{16}$ conducts for a longer period of time than current $I_{12}$, thereby charging capacitor 18 and increasing the output frequency of the VCO, again pulling the VCO oscillator signal back to the mid-pulse of the sync signal. Therefore for a zero phase difference, the charge time of capacitor 18 between times $t_2$ and $t_3$ should equal the discharge times $t_3$ through $t_4$, that is, output current $I_{16}$ has a 50 percent duty cycle during the sync pulse. Moreover with proper selection of resistors 42, 68, 82 and 84, the magnitude of currents $I_{12}$ and $I_{16}$ may be made of equal magnitude, thus providing the symmetrical output current waveform shown in FIG. 2C.

Hence, what has been described is a novel phase detector implemented with NPN transistors for providing a symmetrical push-pull output current operating in response to the phase difference between the falling edge of an oscillator signal and the mid-pulse of a sync signal.

I claim:

1. A phase detector responsive to the phase difference between first and second input signals, comprising:

first means responsive to the first and second input signals for sinking a first current of predetermined magnitude through a first output at simultaneous occurrences of a first state of the first input signal and a first state of the second input signal, said first output of said first means conducting zero first current otherwise, said first means sinking a second current of predetermined magnitude through a second output at simultaneous occurrences of said first state of the first input signal and a second state of the second input signal, said second current flowing from an output of the phase detector in proportion to said predetermined magnitude of said first current;

a current mirror circuit having an input coupled for receiving said first current and having an output for sourcing a third current into the output of the phase detector, said input and output of said current mirror circuit developing first and second potentials respectively; and second means coupled between said input and output of said current mirror for maintaining said first and second potentials substantially equal.

2. The phase detector of claim 1 wherein said current mirror circuit includes:

first and second NPN transistors each having a base, an emitter and a collector, said bases being coupled together, said collectors being coupled to a first source of operating potential;

a first resistor coupled between said emitter of said first transistor and said input of said current mirror circuit;

a second resistor coupled between said emitter of said second transistor and said output of said current mirror circuit; and a third resistor coupled between said base of said first transistor and said first source of operating potential.

3. The phase detector of claim 2 wherein said second means includes:

current supply means having an output for providing a fourth current of predetermined magnitude;

a third NPN transistor having a base, an emitter and a collector, said base being coupled to said input of said current mirror circuit, said collector being coupled to said base of said first transistor, said emitter being coupled to said output of said current supply means; and a fourth NPN transistor having a base, an emitter and a collector, said base being coupled to said output of said current mirror circuit, said collector being coupled to said first source of operating potential, said emitter being coupled to said output of said current supply means.

4. The phase detector of claim 3 wherein said first means includes:

a fifth transistor having a base, an emitter and a collector, said base being coupled for receiving the first input signal, said collector being coupled to said second output of said first means for sinking said second current from the output of the phase detector;

a fourth resistor coupled between said emitter of said fifth transistor and a second source of operating potential; and a sixth transistor having a base, an emitter and a collector, said base being coupled for receiving the second input signal, said collector being coupled to said base of said fifth transistor, said emitter being coupled to said second source of operating potential.

5. The phase detector of claim 4 wherein said current supply means includes:

a seventh transistor having a base, an emitter and a collector, said collector being coupled to said emitters of said third and fourth transistors for conducting said fourth current, said emitter being coupled to said second source of operating potential; and an eighth transistor having a base, an emitter and a collector, said base and collector being coupled together to said base of said seventh transistor, said emitter being coupled to said second source of operating potential, said collector receiving a fifth current of predetermined magnitude in response to said first state of the first input signal.

6. The phase detector of claim 5 wherein said first means further includes:

a ninth transistor having a base, an emitter and a collector, said base being coupled for receiving the first input signal, said collector being coupled to said first source of operating potential;

a fifth resistor coupled between said emitter of said ninth transistor and said collector of said eighth transistor;

a tenth transistor having a base, an emitter and a collector, said collector being coupled to said first output of said first means, said emitter being coupled to said emitter of said fifth transistor;

a sixth resistor coupled between said emitter of said ninth transistor and said base of said tenth transistor;

an eleventh transistor having a base, an emitter and a collector, said collector being coupled to said base of said tenth transistor, said emitter being coupled to said base of said sixth transistor;

a seventh resistor coupled between said emitter of said eleventh transistor and said emitter of said ninth transistor;

a twelfth transistor having a base, an emitter and a collector, said collector being coupled to said base of said second transistor;

an eighth resistor coupled between said emitter of said ninth transistor and said base of said twelfth transistor; and a ninth resistor coupled between said emitter of said twelfth transistor and said second source of operating potential.

7. The phase detector of claim 6 further including:

a second emitter formed within said first transistor; and a tenth resistor coupled between said second emitter of said first transistor and said base of said tenth transistor.

8. The phase detector of claim 7 wherein said first means further includes:

a thirteenth transistor having a base, an emitter and a collector, said collector being coupled to said base of said first transistor, said emitter being coupled to said base of said ninth transistor and further coupled for receiving the first input signal;

a fourteenth transistor having a base, an emitter and a collector, said base and collector being coupled together to said base and emitter of said thirteenth transistor;

a fifteenth transistor having a base and collector coupled together to said emitter of said fourteenth transistor and having an emitter; and an eleventh resistor coupled between said emitter of said fifteenth transistor and said second source of operating potential.

9. The phase detector of claim 8 wherein said second means further includes:

a sixteenth transistor having a base, an emitter and a collector, said collector being coupled to said first source of operating potential, said emitter being coupled to said collector of said thirteenth transistor, said base being coupled to said base of said thirteenth transistor;

a twelfth resistor coupled between said base of said sixteenth transistor and said first source of operating potential; and a thirteenth resistor coupled between said base of said second transistor and said base of said first transistor.

10. A phase detector for providing an output signal in response to the phase difference between first and second input signals, comprising:

first means responsive to the first and second input signals for sinking a first current of predetermined magnitude through a first output at simultaneous occurrences of a first state of the first input signal and a first state of the second input signal, said first output of said first means conducting zero first current otherwise, said first means sinking a second current of predetermined magnitude through a second output at simultaneous occurrences of said first state of the first input signal and a second state of the second input signal, said second current flowing from an output of the phase detector in proportion to said predetermined magnitude of said first current;

current supply means having an output for providing a third current of predetermined magnitude; and second means having an input coupled for receiving said first current and having an output for sourcing a fourth current of predetermined magnitude proportional to said first current into the output of the phase detector, said second means including, (a) first and second NPN transistors each having a base, an emitter and a collector, said bases being coupled together, said collectors being coupled to a first source of operating potential, (b) a first resistor coupled between said emitter of said first transistor and said input of said second means, (c) a second resistor coupled between said emitter of said second transistor and said output of said second means, (d) a third resistor coupled between said base of said first transistor and said first source of operating potential, (e) a third NPN transistor having a base, an emitter and a collector, said base being coupled to said input of said second means, said collector being coupled to said base of said first transistor, said emitter being coupled to said output of said current supply means, and (f) a fourth NPN transistor having a base, an emitter and a collector, said base being coupled to said output of said second means, said collector being coupled to said first source of operating potential, said emitter being coupled to said output of said current supply means.

11. The phase detector of claim 10 wherein said first means includes:

a fifth transistor having a base, an emitter and a collector, said base being coupled for receiving the first input signal, said collector being coupled to said second output of said first means for sinking said second current from the output of the phase detector;

a fourth resistor coupled between said emitter of said fifth transistor and a second source of operating potential; and a sixth transistor having a base, an emitter and a collector, said base being coupled for receiving the second input signal, said collector being coupled to said base of said fifth transistor, said emitter being coupled to said second source of operating potential.

12. The phase detector of claim 11 wherein said current supply means includes:

a seventh transistor having a base, an emitter and a collector, said collector being coupled to said emitters of said third and fourth transistors for conducting said fourth current, said emitter being coupled to said second source of operating potential; and an eighth transistor having a base, an emitter and a collector, said base and collector being coupled together to said base of said seventh transistor, said emitter being coupled to said second source of operating potential, said collector receiving a fifth current of predetermined magnitude in response to said first state of the first input signal.

13. The phase detector of claim 12 wherein said first means further includes:

a ninth transistor having a base, an emitter and a collector, said base being coupled for receiving the first input signal, said collector being coupled to said first source of operating potential;

a fifth resistor coupled between said emitter of said ninth transistor and said collector of said eighth transistor;

a tenth transistor having a base, an emitter and a collector, said collector being coupled to said first output of said first means, said emitter being coupled to said emitter of said fifth transistor;

a sixth resistor coupled between said emitter of said ninth transistor and said base of said tenth transistor;

an eleventh transistor having a base, an emitter and a collector, said collector being coupled to said base of said tenth transistor, said emitter being coupled to said base of said sixth transistor;

a seventh resistor coupled between said emitter of said eleventh transistor and said emitter of said ninth transistor;

a twelfth transistor having a base, an emitter and a collector, said collector being coupled to said base of said second transistor;

an eighth resistor coupled between said emitter of said ninth transistor and said base of said twelfth transistor; and a ninth resistor coupled between said emitter of said twelfth transistor and said second source of operating potential.

14. The phase detector of claim 13 further including:

a second emitter formed within said first transistor; and a tenth resistor coupled between said second emitter of said first transistor and said base of said tenth transistor.

15. The phase detector of claim 14 wherein said first means further includes:

a thirteenth transistor having a base, an emitter and a collector, said collector being coupled to said base of said first transistor, said emitter being coupled to said base of said ninth transistor and further coupled for receiving the first input signal;

a fourteenth transistor having a base, an emitter and a collector, said base and collector being coupled together to said base and emitter of said thirteenth transistor;

a fifteenth transistor having a base and collector coupled together to said emitter of said fourteenth transistor and having an emitter; and an eleventh resistor coupled between said emitter of said fifteenth transistor and said second source of operating potential.

16. The phase detector of claim 15 wherein said second means further includes:

a sixteenth transistor having a base, an emitter and a collector, said collector being coupled to said first source of operating potential, said emitter being coupled to said collector of said thirteenth transistor, said base being coupled to said base of said thirteenth transistor;

a twelfth resistor coupled between said base of said sixteenth transistor and said first source of operating potential; and a thirteenth resistor coupled between said base of said second transistor and said base of said first transistor.

17. An integrated phase detector responsive to the phase difference between first and second input signals, comprising:

first means responsive to the first and second input signals for sinking a first current of predetermined magnitude through a first output at simultaneous occurrences of a first state of the first input signal and a first state of the second input signal, said first output of said first means conducting zero first current otherwise, said first means sinking a second current of predetermined magnitude through a second output at simultaneous occurrences of said first state of the first input signal and a second state of the second input signal, said second current flowing from an output of the phase detector in proportion to said predetermined magnitude of said first current;

a current mirror circuit having an input coupled for receiving said first current and having an output for sourcing a third current into the output of the phase detector, said input and output of said current mirror circuit developing first and second potentials respectively; and second means coupled between said input and output of said current mirror for maintaining said first and second potentials substantially equal.

18. The phase detector of claim 17 wherein said current mirror circuit includes:

first and second NPN transistors each having a base, an emitter and a collector, said bases being coupled together, said collectors being coupled to a first source of operating potential;

a first resistor coupled between said emitter of said first transistor and said input of said current mirror circuit;

a second resistor coupled between said emitter of said second transistor and said output of said current mirror circuit; and a third resistor coupled between said base of said first transistor and said first source of operating potential.

19. The phase detector of claim 18 wherein said second means includes:

current supply means having an output for providing a fourth current of predetermined magnitude;

a third NPN transistor having a base, an emitter and a collector, said base being coupled to said input of said current mirror circuit, said collector being coupled to said base of said first transistor, said emitter being coupled to said output of said current supply means; and a fourth NPN transistor having a base, an emitter and a collector, said base being coupled to said output of said current mirror circuit, said collector being coupled to said first source of operating potential, said emitter being coupled to said output of said current supply means.

20. The phase detector of claim 19 wherein said first means includes:

a fifth transistor having a base, an emitter and a collector, said base being coupled for receiving the first input signal, said collector being coupled to said second output of said first means for sinking said second current from the output of the phase detector;

a fourth resistor coupled between said emitter of said fifth transistor and a second source of operating potential; and a sixth transistor having a base, an emitter and a collector, said base being coupled for receiving the second input signal, said collector being coupled to said base of said fifth transistor, said emitter being coupled to said second source of operating potential.

* * * * *